United States Patent [19]

von Gentzkow et al.

[11] Patent Number: 5,648,171

[45] Date of Patent: Jul. 15, 1997

[54] EPOXY RESIN MIXTURES CONTAINING PHOSPHORUS ACID/EPOXY RESIN ADDUCTS

[75] Inventors: Wolfgang von Gentzkow, Kleinsendelbach; Jürgen Huber, Erlangen; Heinrich Kapitza, Fürth; Wolfgang Rogler, Möhrendorf; Hans-Jerg Kleiner, Kronberg, all of Germany

[73] Assignee: Siemens Aktiengesellschaft, München, Germany

[21] Appl. No.: 522,333

[22] PCT Filed: Mar. 10, 1994

[86] PCT No.: PCT/EP94/00750

§ 371 Date: Sep. 14, 1995

§ 102(e) Date: Sep. 14, 1995

[87] PCT Pub. No.: WO94/21706

PCT Pub. Date: Sep. 29, 1994

[30] Foreign Application Priority Data

Mar. 15, 1993 [DE] Germany ............... 43 08 184.3

[51] Int. Cl.$^6$ .................. C08G 59/14; C08G 59/50; H05K 1/03

[52] U.S. Cl. ............... 428/413; 428/415; 428/417; 428/901; 523/429; 523/466; 528/27; 528/103; 528/108; 528/367; 528/368; 528/398; 528/399; 525/502; 525/504; 525/505; 525/507; 525/525

[58] Field of Search ............... 428/413, 415, 428/417, 901; 523/429, 466; 528/27, 103, 108, 367, 368, 398, 399; 525/502, 504, 505, 507, 525

[56] References Cited

U.S. PATENT DOCUMENTS

| | | | |
|---|---|---|---|
| 2,732,367 | 1/1956 | Shokal et al. | 528/108 |
| 2,766,139 | 10/1956 | Green et al. | 117/103 |
| 3,373,135 | 3/1968 | Jenkner et al. | 260/45.7 |
| 3,398,019 | 8/1968 | Langguth et al. | 117/138 |
| 4,783,345 | 11/1988 | Kleeberg et al. | 427/96 |
| 5,364,893 | 11/1994 | von Gentzkow et al. | 523/429 |
| 5,376,453 | 12/1994 | von Gentzkow et al. | 428/415 |

FOREIGN PATENT DOCUMENTS

| | | |
|---|---|---|
| 0 243 201 | 10/1987 | European Pat. Off. |
| 27 43 680 | 4/1985 | Germany . |
| 10794 | of 1911 | United Kingdom . |
| 1112139 | 5/1968 | United Kingdom . |

OTHER PUBLICATIONS

Pitts, J., "Antimony–Halogen Synergistic Reactions in Fire Retardants", *J.Fire and Flammability*, vol. 3 (1972), pp. 50–83.

Bonsignore, P., "A new flame-retardant microfiber reinforcement for thermoplastics", *Plastics Engineering*, Oct. 1976, pp. 41–43.

Woods, W. et al., "A new heat-stable zinc borate fire retardant," *Modern Plastics* (Jun. 1970), pp. 140–150.

Kuryla, W. et al., "Flame Retardancy of Polymeric Materials," vol. 1, New York (1973), pp. 24–61.

*Primary Examiner*—Frederick Krass
*Attorney, Agent, or Firm*—Kenyon & Kenyon

[57] ABSTRACT

Epoxy resin mixtures for producing prepregs and composites that are available at low cost and can be processed well yield flame-retardant molding materials even without the addition of flame retardants, and these molding materials have a high glass transition temperature and also have an improved interlaminar adhesion and adhesion to copper when they contain the following components:

a phosphorus-modified epoxy resin with an epoxy value of 0.02 to 1 mol/100 g, composed of structural units derived from (A) polyepoxy compounds with at least two epoxy groups per molecule and (B) at least one compound from the group consisting of phosphinic acids, phosphonic acids, pyrophosphonic acids and phosphonic acid half-esters, and an aromatic polyamine as the hardener.

17 Claims, No Drawings

EPOXY RESIN MIXTURES CONTAINING PHOSPHORUS ACID/EPOXY RESIN ADDUCTS

BACKGROUND OF THE INVENTION

This invention concerns epoxy resin mixtures for producing prepregs and composites and it also concerns the prepregs and composites produced from said epoxy resin mixtures.

Composites based on epoxy resins and organic or inorganic reinforcing materials have gained an important position in many areas of the industry and daily life. The reasons include first the relatively simple and reliable processing of epoxy resins and secondly the good mechanical and chemical properties of cured epoxy resin molding materials that make it possible to adapt to a variety of applications and permit advantageous utilization of the properties of all the materials that make up the composite.

Epoxy resins are preferably processed to composites by the intermediate step of producing prepregs first. For this purpose, organic or inorganic reinforcing materials or embedding components in the form of fibers, nonwovens and woven fabrics as well as other flat materials are impregnated with the resin. In most cases, this is accomplished with a solution of the resin in a volatile solvent. The resulting prepregs according to this process must not be sticky but they should not be fully cured either. Instead, the resin matrix should simply be prepolymerized. In addition, the prepregs must have sufficient storage stability. Thus, for example, a storage stability of at least three months is required for the production of circuit boards. In further processing to form composites, the prepregs must also melt at higher temperatures and they must form a strong and permanent bond under pressure with both the reinforcing materials or embedding materials and the materials intended for the composite—in other words, the cross-linked epoxy resin material must yield a high interlaminar adhesion with the reinforcing materials or the embedding components and with the materials to be bonded, such as metallic, ceramic, mineral and organic materials.

In general, a high mechanical and thermal strength, good mechanical and thermal stability, thermal undeformability, and good aging resistance are required of composites when cured. For electrotechnical and electronic applications, there is also the requirement that the electric insulation properties must be permanently high, and for many special applications there are numerous additional requirements. For example, good thermal undeformability over a wide temperature range, good adhesion to glass and copper, a high surface resistance, a low dielectric loss factor, good machining properties (punchability, drillability), a low water uptake and high corrosion resistance are required if these materials are to be used as circuit board materials.

With increasing loads and extensive use of the composites, the thermal undeformability requirement becomes especially important. This means that the materials must withstand high temperatures during processing and use without showing any deformation or damage to the composite—due to delamination, for example. In dip soldering, for example, circuit boards are exposed to a temperature of 270° C. Likewise, local temperatures of more than 200° C. may occur briefly during cutting and drilling operations. Materials with a high glass transition temperature $T_G$ have good properties in this regard. If the glass transition temperature is higher than these temperatures, thermal undeformability is assured in the entire temperature range covered during processing, and damage such as warpage and delamination can be largely ruled out. The epoxy resin currently used on a large scale worldwide for FR4 composites has a glass transition temperature of only 130° C. after curing. However, this results in the damage described above and thus leads to rejects in production. Therefore, there has long been a demand for inexpensive materials that can be processed relatively well and have a glass transition temperature higher than about 180° C.

Another requirement that has become increasingly important in recent times is that these materials must be flame retardant. In many areas, this requirement is a top priority because of the danger to humans and property—for example, in construction materials for aircraft and motor vehicles and for public transportation. Flame retardancy of circuit board materials is an indispensable requirement for electrotechnical applications and especially for electronic applications because of the high value of the electronic components mounted on the circuit boards.

Therefore, in order to evaluate flammability, a material must pass one of the most severe material test standards, namely the V-0 classification according to UL 94V. In this test, a test article is exposed to a defined flame vertically at the lower edge. The total burning times in 10 tests must not exceed 50 sec. This requirement is difficult to satisfy, especially when the material has thin walls, as is customary in electronics. The epoxy resin used industrially throughout the world for FR4 composites meets this requirement only because it contains approx. 30–40% (based on the resin) ring-brominated aromatic epoxy components—in other words, it contains approx. 17–21% bromine. Comparably high concentrations of halogen compounds are used for other applications and are often combined with antimony trioxide as a synergist. The problem with these compounds is that although they are excellent flame retardants, they also have some highly objectionable properties. For example, antimony trioxide is on the list of carcinogenic chemicals, and aromatic bromine compounds not only release highly corrosive free bromine radicals and hydrogen bromide when they undergo thermal decomposition, but especially when decomposition occurs in the presence of oxygen, highly brominated aromatics can also lead to polybromo-dibenzofurans and polybromo-dibenzodioxins (PBDs) which are extremely toxic. Furthermore, disposal of waste materials containing bromine also poses considerable problems.

Materials that meet the demand for a good thermal stability include, for example, molding materials based on bismaleinimide/triazine (BT) with a $T_G$ of approx. 200° C. or polyimide (PI) with a $T_G$ of 260°–270° C. Recently, BT-epoxy blends with a $T_G$ of 180° C. have also been available, but laminates produced with these resin systems cannot be processed or machined as well as laminates based on epoxy resin. Thus, for example, production of laminates based on polyimide requires a compression molding temperature of approx. 230° C. and a much longer post-curing time (approx. 8 hrs) at temperatures of 230° C. Another serious disadvantage of these resin systems is that the price of materials is 6 to 10 times higher.

A comparatively inexpensive resin system is obtained when aromatic and/or heterocyclic polyepoxy resins, i.e., polyglycidyl compounds, are combined with aromatic polyamines acting as the hardener. Such polyamines, which are disclosed in German patent 2,743,680, for example, lead to cross-linked polymers that have an especially good thermal undeformability under heat and good resistance to aging. According to European patent 274,646, when 1,3,5- tris-(3-amino-4-alkylphenyl)-2,4,6-trioxo-hexahydrotriazines are used as hardeners, the resulting laminates have a glass transition temperature of up to 245° C. and are characterized by good processing and machining properties.

Although the flammability properties of these resin systems may vary greatly, they all have the disadvantage that their flame retardancy is inherently inadequate. Thus, in order to pass the flammability test according to UL 94V with a classification of V-0, which is essential for many applications, it has not yet been possible to do without the use of the highly effective brominated flame retardants. First, this results in the potential hazards associated with bromine compounds, and secondly, there are some unavoidable negative effects on the thermal and mechanical properties due to the use of bromine compounds.

For these reasons, there has been no lack of attempts to replace brominated flame retardants with less problematical substances. For example, fillers with a quenching gas effect have been proposed, such as aluminum oxide hydrates (see: *J. Fire and Flammability*, vol. 3 (1972), pages 51 ff.), basic aluminum carbonates (see: *Plast. Engng.*, vol. 32 (1976), pages 41 ff.) and magnesium hydroxides (European patent 243,201) as well as vitrifying fillers such as borates (see: *Modern Plastics*, vol. 47 (1970), no. 6, pages 140 ff.) and phosphates (U.S. Pat. Nos. 2,766,139 and 3,398,019). However, all these fillers have the disadvantage that they often have an extremely negative effect on the mechanical, chemical and electrical properties of the composites. In addition, they require special processing techniques which are usually more expensive because they increase the viscosity of the filled resin system and they also have a tendency toward sedimentation.

The flame-retardant effect of red phosphorus has also been described previously (British patent 1,112,139), optionally in combination with very finely divided silicon dioxide or aluminum oxide hydrate (U.S. Pat. No. 3,373, 135). This yields materials that restrict the possible uses for electrotechnical and electronic applications because of the phosphoric acid that is released in the presence of moisture and the resulting corrosion problems. In addition, organic phosphorus compounds such as phosphoric acid esters, phosphonic acid esters and phosphines have already been proposed as flame-retardant additives (see: W. C. Kuryla and A. J. Papa *Flame Retardancy of Polymeric Materials*, vol. 1, pages 24-38 and 52-61, Marcel Dekker Inc., New York, 1973). Since these compounds are known for their "plasticizing" properties and are in fact used internationally as plasticizers for polymers on a large scale (British patent 10,794), this alternative is not very promising either.

Organic phosphorus compounds such as phosphorus compounds that contain epoxy groups and can be anchored in the epoxy resin network can also be used to make epoxy resins flame-retardant. Thus, for example, European patent 384, 940 discloses epoxy resin blends that contain commercially available epoxy resin, the above-mentioned aromatic polyamine 1,3,5-tris-(3-amino-4-alkylphenyl)-2,4,6-trioxo-hexahydrotriazine and a phosphorus compound that contains an epoxy group and is based on glycidyl phosphate, glycidyl phosphonate or glycidyl phosphinate. Without adding halogen, flame-retardant laminates or composites that can be classified in the UL 94 V-0 class and have a glass transition temperature of >200° C. can be produced with such epoxy resin blends. In addition, these epoxy resin blends can be processed by methods comparable to those used with the current epoxy resins.

It is general knowledge that the interlaminar adhesion and the adhesion to copper of laminates with a high glass transition temperature, such as those based on polyimide or BT resins, is lower than that of the halogenated FR4 laminates used predominantly today. This is also true of the laminates described in European patent 384,940. Many of the circuit boards produced today are so-called multi-layer circuit boards (ML) that have several conducting layers that are kept at a distance from each other and are insulated by epoxy resin compounds. However, the trend in ML technology has been toward an ever increasing number of conducting layers. For example, today MLs with more than 20 conducting levels are being produced. An excessive thickness of the ML must be avoided for technical reasons, so the distance between the conducting levels becomes smaller and smaller and thus the interlaminar adhesion and the adhesion to copper become increasingly problematical with ML laminates that have a high glass transition temperature.

In circuit board technology, interlaminar adhesion is usually determined indirectly. Circuit boards must pass a measling test that is widely used for this purpose. In this test, a laminate without the copper lamination is treated with a tin chloride solution and then with water at a high temperature and then is immersed for 20 sec in a hot soldering bath at 260° C. The laminate is then inspected visually for delamination. With regard to lamination resins with a high glass transition temperature (180° C. or higher), most of the increasingly thin core components used in ML technology today will not pass this test because their interlaminar adhesion is inadequate for such thin laminates. Other problems caused by inadequate interlaminar adhesion are encountered in further processing of laminates for the electronics industry by such methods as drilling and milling. Therefore, the drilling and milling speeds must be reduced in comparison with those used with FR4 material.

Therefore, there has been a great demand for electronics laminates that first of all meet the required level of flame retardancy without using halogen, as indicated above, and secondly have a high glass transition temperature with good interlaminar adhesion at the same time—even when extremely thin core components are produced. No satisfactory combination of these properties has previously been achieved, especially not for extremely thin laminates such as those use in ML technology.

The object of this invention is to provide epoxy resin blends that are available by simple methods industrially and are thus inexpensive, that can be processed by methods comparable to those used with the conventional industrial epoxy resins and that are suitable for production of prepregs and laminates for the multi-layer technology. These new epoxy resin blends should also yield molding materials that are flame-retardant (in other words, classified according to UL 94 V-0) without the use of any halogen and they must have the highest possible glass transition temperature ($\geq 180°$ C.) while also having an improved interlaminar adhesion and adhesion to copper that are adequate for producing ML cores.

SUMMARY OF THE INVENTION

This is accomplished according to this invention by having the epoxy resin blends contain the following components:
  a phosphorus-modified epoxy resin with an epoxy value of 0.02 to 1 mol/100 g, composed of structural units derived from
  (A) polyepoxy compounds having at least two epoxy groups per molecule and (B) at least one compound from the group consisting of phosphinic acids, phosphonic acids, pyrophosphonic acids and phosphonic acid half-esters, and an aromatic polyamine as a hardener having the following structure:

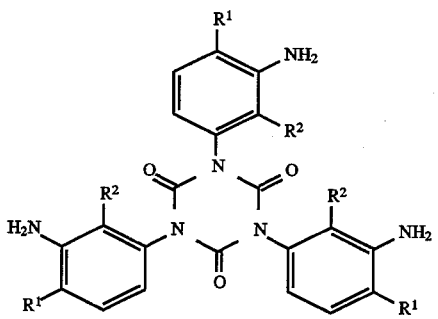

where one of the $R^1$ and $R^2$ groups on each of the three aromatic partial structures denotes a hydrogen and the other is an alkyl.

DETAILED DESCRIPTION OF THE INVENTION

The phosphorus-modified epoxy resins are synthesized by reacting conventional commercial polyepoxy resins (polyglycidyl resins) with the following phosphorus compounds:

phosphonic acids: phosphonic acids with alkyl groups, preferably with 1 to 6 carbons, or with aryl groups, especially benzenephosphonic acid;

phosphinic acids: dialkyl phosphinic acids, preferably with 1 to 6 carbons in the alkyl group, alkylaryl phosphinic acids or diaryl phosphinic acids;

pyrophosphonic acids: compounds on which the above-mentioned phosphonic acids are based are preferred; pyrophosphonic acids are formed by dehydration of phosphonic acids according to known methods (see: Houben-Weyl, *Methods of Organic Chemistry*, 4th edition, vol. XII/1 (1963), page 606);

phosphonic acid half-esters: half-esters—in other words, monoesters—of the above phosphonic acids with aliphatic alcohols, especially low-boiling aliphatic alcohols such as methanol and ethanol are preferred; phosphonic acid monoesters can be synthesized by partial hydrolysis of the corresponding phosphonic acid diesters, especially by using sodium hydroxide solution (see: *J. Organometallic Chem.*, vol. 12 (1960), page 459) or by partial esterification of free phosphonic acids with the proper alcohol.

In general, both aliphatic and aromatic glycidyl compounds as well as the mixtures thereof can be used to synthesize phosphorus-modified epoxy resins. Preferred glycidyl compounds include bisphenol A diglycidyl ether, bisphenol F diglycidyl ether, polyglycidyl ethers of phenol-formaldehyde novolacs and of cresol-formaldehyde novolacs, diglycidyl esters of phthalic acid, tetrahydrophthalic acid, isophthalic acid and terephthalic acid, as well as blends of these epoxy resins. Other polyepoxies that can be used include, for example, hydrogenated bisphenol A and bisphenol F diglycidyl ether, hydantoin-epoxy resins, triglycidyl isocyanurate, triglycidyl-p-aminophenol, tetraglycidyl-diaminodiphenylmethane, tetraglycidyl-diaminodiphenyl ether, tetrakis-(4-glycidoxyphenyl)-ethane, uracil-epoxy resins, oxazolidinone-modified epoxy resins and epoxies described in the *Handbook of Epoxy Resins* by Henry Lee and Kris Neville, McGraw-Hill Book Company 1967, and in the monograph Epoxy Resins by Henry Lee, American Chemical Society, 1970. The average molecular weight $M_n$ of the polyepoxy compounds is in general 150 to 4000, preferably 300 to 1800.

Depending on the choice of the starting molecular ratio of the phosphorus compound to the epoxy resin, it is possible to produce phosphorus-modified epoxy resins with a varying epoxy content and also with a varying phosphorus content. Phosphorus-modified epoxy resins with an average of one epoxy group per molecule, but preferably with two epoxy groups, are used to produce the laminates. In general, the starting molar ratio is selected so the reaction products will contain 0.5 to 13 wt % phosphorus. The phosphorus content is preferably 1 to 8%, especially 2 to 5%. The total phosphorus content of the epoxy resin mixture should be 0.5 to 6 wt %, preferably 1 to 4 wt %.

The epoxy resin mixtures according to this invention may also contain a phosphorus-free aromatic and/or heterocyclic epoxy resin. A cycloaliphatic epoxy resin may also be added to this epoxy resin. In general, up to 80 wt % phosphorus-modified epoxy resin may be replaced by phosphorus-free epoxy resin.

Adding the phosphorus-free epoxy resin serves to achieve certain properties in the laminates produced from the epoxy resin mixtures according to this invention. The mixing ratio of the two components is determined by the flame-retardancy requirement according to UL 94 V-0 for a layer thickness of 1.6 mm. This means that the phosphorus-free component can be added only to the extent that the total mixture still contains enough phosphorus that the above requirement is met. Therefore, in the case of epoxy resins with a high phosphorus content, it is possible to add more of the phosphorus-free epoxy resin than in the case of epoxy resins with a low phosphorus content.

The following polyglycidyl compounds are especially suitable as the additional phosphorus-free polyepoxy resin or to produce the phosphorus-modified epoxy resins: aromatic polyglycidyl ethers such as bisphenol A diglycidyl ether, bisphenol F diglycidyl ether and bisphenol S diglycidyl ether, polyglycidyl ethers of phenol-formaldehyde and cresol-formaldehyde resins, resorcinol diglycidyl ether, tetrakis-(p-glycidylphenyl)-ethane, di- and polyglycidyl esters of phthalic acid, isophthalic acid and terephthalic acid, as well as trimellitic acid, N-glycidyl compounds of aromatic amines and heterocyclic nitrogen-containing bases such as N,N-diglycidylaniline, N,N,O-triglycidyl-p-aminophenol, triglycidyl isocyanurate and N,N,N',N'-tetraglycidyl-bis-(p-aminophenyl)-methane, hydantoin-epoxy resins and uracil-epoxy resins as well as di- and polyglycidyl compounds of polyhydric aliphatic alcohols such as 1,4-butanediol, trimethylolpropane and polyalkylene glycols. In addition, oxazolidinone-modified epoxy resins are also suitable. Such compounds are already known (see: *Angew. Makromol. Chem.*, vol. 44 (1975), pages 151–163, and U.S. Pat. No. 3,334,110). The reaction product of bisphenol-A diglycidyl ether with diphenylmethane diisocyanate (in the presence of a suitable accelerator) can be mentioned as an example. The polyepoxy resins may be used individually or in the form of a mixture to produce the phosphorus-modified epoxy resin. An epoxidized novolac is the preferred type of polyepoxy resin.

The following compounds in particular are used as the phosphorus component to produce the phosphorus-modified epoxy resins:

phosphonic acids: methanephosphonic acid, ethanephosphonic acid, propanephosphonic acid, hexanephosphonic acid and benzenephosphonic acid;

phosphinic acids: dimethyl phosphinic acid, methylethyl phosphinic acid, diethyl phosphinic acid, dipropyl phosphinic acid, ethyl phenyl phosphinic acid and diphenyl phosphinic acid;

pyrophosphonic acids: methanepyrophosphonic acid, propane-pyrophosphonic acid and butanepyrophosphonic acid;

phosphonic acid monoesters: methanephosphonic acid monomethyl ester, propanephosphonic acid monoethyl ester and benzenephosphonic acid monomethyl ester.

The phosphorus-modified epoxy resins can be produced by reacting the polyepoxy compounds with the acids that contain phosphorus, preferably in an inert solvent or diluent, but also in substance, assuming the reaction process is suitably modified. The phosphorus-modified epoxy resins have an average molecular weight $M_n$ of up to 10,000, preferably 200 to 5000, and especially 400 to 2000.

If solvents or diluents are used, they should be aprotic and preferably polar. Examples include N-methylpyrrolidone, dimethylformamide, ethers such as diethyl ether, tetrahydrofuran, dioxane, ethylene glycol monoether and diether, propylene glycol monoether and diether and butylene glycol monoether and diether, where the alcohol component of the mono- or diether is derived from monoalcohols with an optionally branched alkyl group having 1 to 6 carbon atoms; ketones such as acetone, methylethyl ketone, methyl isopropyl ketone, methyl isobutyl ketone and cyclohexanone; esters such as ethyl acetate, butyl acetate, ethyl glycol acetate and methoxypropyl acetate; halogenated hydrocarbons; (cyclo)aliphatic and/or aromatic hydrocarbons such as hexane, heptane, cyclohexane, toluene and the various xylenes; aromatic solvents with a boiling point in the range of approx. 150° to 180° C. (higher-boiling mineral oil fractions such as Solvesso(®)). The solvents may be used individually or in a mixture. The reactions take place at −20° C. to 130° C., preferably at 20°–90° C.

Some of the aromatic polyamines that serve as hardeners in the epoxy resin mixtures according to this invention are already known. Polyamines having the stated structure where $R^1$=alkyl and $R^2$=H are described in European patent 274,646. They are synthesized by trimerization of 2,4-diisocyanato-alkylbenzenes and subsequent hydrolysis of the remaining isocyanate groups. Compounds where $R^1$=H and $R^2$=alkyl are similarly obtained by trimerization of 2,6-diisocyanato-alkylbenzenes and subsequent hydrolysis. Both polyamines of the two types mentioned above as well as mixtures of these two compounds can be used as hardeners in the epoxy resin mixtures according to this invention. In addition, polyamines that are obtained by trimerization of mixtures of 2,4- and 2,6-diisocyanato-alkylbenzenes and subsequent hydrolysis of the trimers can also be used. Such mixtures are available on a large scale commercially and make it possible to produce the hardener component inexpensively.

In hydrolysis of the trimerization products that contain isocyanate groups, a reaction may also take place between the isocyanate groups and the amino groups. Heterocyclic polyamines with urea groups are obtained as a by-product of the hydrolysis reaction. Such polyamines can also be used as additive hardener components in the epoxy resin mixtures according to this invention - in other words, they may be used in mixture with the actual hardener. In addition to containing the actual hardener or hardener mixtures of the type described above, the epoxy resin mixtures according to this invention may also contain aromatic polyamines of another type such as 4,4'-diaminodiphenylmethane and 4,4'-diaminodiphenylsulfone and/or other heterocyclic polyamines. The maximum amount of such polyamines in the hardener mixture is generally 30 wt %.

The equivalent ratio of the starting epoxy function to the starting amine hydrogen function in the epoxy resin mixtures according to this invention may vary between 1:0.5 and 1:1.1, preferably 1:0.7 to 1:0.9.

The epoxy resin mixtures according to this invention may also contain accelerators, which are known to play an important role in curing epoxy resins. Tertiary amines or imidazoles are generally used. Suitable amines include, for example, tetramethylethylenediamine, dimethyloctylamine, dimethylaminoethanol, dimethylbenzylamine, 2,4,6-tris-(dimethylaminomethyl)-phenol, N,N'-tetramethyl-diaminodiphenylmethane, N,N'-dimethylpiperazine, N-methylmorpholine, N-methylpiperidine, N-ethylpyrrolidine, 1,4-diazabicyclo(2,2,2)-octane and quinolines. Suitable imidazoles include, for example, 1-methylimidazole, 2-methylimidazole, 1,2-dimethylimidazole, 1,2,4,5-tetramethylimidazole, 2-ethyl-4-methylimidazole, 1-cyanoethyl-2-phenylimidazole and 1-(4,6-diamino-s-triazinyl-2-ethyl)-2-phenylimidazole. The accelerators are added in a concentration of 0.01 to 2 wt %, preferably 0.05 to 1%, each based on the epoxy resin mixture.

To produce the prepregs, the individual components are dissolved separately or together in inexpensive solvents such as acetone, methylethyl ketone, ethyl acetate, methoxyethanol, dimethylformamide and toluene or in a mixture of such solvents, then they are optionally combined to form one solution and are processed on conventional impregnation systems for impregnating fibers of organic or inorganic materials such as glass, metal, minerals, carbon, aramid, polyphenylene sulfide and cellulose as well as wovens or nonwovens produced from these materials or for coating other flat materials such as metal or plastic sheets. The impregnating solutions may optionally also contain other halogen-free additives to improve the flame retardancy, some of which may be in the form of a homogeneous solution or dispersion. Such additives include, for example, melamine cyanurates, melamine phosphates, pulverized polyether imide, polyether sulfone and polyimide.

Mainly glass cloth is used to produce prepregs for circuit board technology. Especially prepregs made of glass cloth grades having a weight of 25 to 200 g/m² are used for multi-layer circuit boards. Prepregs with a lower weight may also be produced as required using impregnating solutions of the type described above. The impregnated or coated reinforcing materials or embedding components are dried at an elevated temperature, which removes the solvent while also inducing prepolymerization of the impregnating resin. On the whole, this yields an extraordinarily good cost/benefit ratio.

The resulting coatings and prepregs are not sticky and they are stable when stored at room temperature for a period of three months or more—in other words, their storage stability is adequate. They can be pressed at temperatures up to 220° C. to form laminates that are characterized by a high glass transition temperature of ≧180° C. and an inherent flame retardancy. When glass cloth is used in the amount of 60–62 wt %, based on the laminate, the material will pass the burn test according to UL 94 V with a definite V-0 classification without the addition of halogen compounds or any other flame-retardant additives, even when the test object has a wall thickness of 1.6 mm or even 0.8 min. It has proven to be especially advantageous that no corrosive or highly toxic by-products are formed and the amount of smoke released is greatly reduced in comparison with other polymer materials, especially brominated epoxy resin molding materials.

The cured laminates are also characterized by a low thermal expansion coefficient that is constant over a wide temperature range and by a high chemical resistance and corrosion resistance, a low water absorbency and very good electric properties. Adhesion to the reinforcing materials and to the sandwich layers is excellent. When using reinforcing materials of the aforementioned type, prepregs for construction materials that are exposed to high stresses can be produced. These construction materials are suitable for applications in mechanical engineering, automotive engineering, aeronautical engineering and electronic engineering—for example, in the form of prepregs for producing circuit boards, especially multi-layer circuits.

Special advantages of using this material for circuit boards include the high adhesion strength to printed conductors made of copper, a high delamination strength and excellent machining properties, as manifested by the fact that satisfactory holes can be produced with little wear on the drill bits when drilling for plated-through holes. Materials produced using the epoxy resin mixtures according to this invention, especially multi-layer circuit boards with thin cores of $\leq 100/\mu m$, can be produced more reliably and less expensively.

This invention will now be illustrated in detail on the basis of the following embodiments.

EXAMPLE 1

Preparing a phosphinic acid-modified epoxy resin

Mix 400 parts by weight of an epoxidized novolac (epoxy value 0.56 mol/100 g, average functionality 3.6) dissolved in 170 parts by weight methylethyl ketone with 50 parts by weight methylethyl phosphinic acid. Stir the solution at reflux for 60 minutes at an oil bath temperature of 100° C. The reaction product has an epoxy value of 0.40 mol/100 g. After a storage time of 96 hours, the epoxy value is 0.39 mol/100 g. The phosphorus content of the reaction product is 3.2%.

EXAMPLE 2

Preparing a phosphonic acid-modified epoxy resin

Mix 400 parts by weight of a bisphenol F diglycidyl ether (epoxy value 0.61 mol/100 g), dissolved in 250 parts by weight methylethyl ketone with 38 parts by weight methanephosphonic acid. Stir the solution at reflux for 60 minutes at an oil bath temperature of 100° C. The reaction product has an epoxy value of 0.38 mol/100 g. After a storage time of 96 hours, the epoxy value is 0.37 mol/100 g. The phosphorus content of the reaction product is 3.8%.

EXAMPLE 3

Producing the prepreg with a phosphinic acid-modified epoxy resin

Mix a solution of 75 parts by weight of the reaction product obtained according to Example 1 (epoxy value 0.40 mol/100 g) in methylethyl ketone with a solution of 25 parts by weight of a polyamine obtained by trimerization of a 4:1 mixture of toluene 2,4-diisocyanate and toluene 2,6-diisocyanate and subsequent hydrolysis (yielding a product with an $NH_2$ value of 9.35%) in 50 parts by weight methylethyl ketone and 8 parts by weight dimethylformamide. Continuously impregnate glass cloth (weight 106 g/m²) with the resulting solution using a laboratory impregnation system and dry in a vertical drying installation at temperatures of 50°–160° C. Prepregs produced in this way are nonsticky and are stable in storage at room temperature (max. 21° C. and max. 50% relative humidity. Determine the residual moisture content and the residual gelation time in order to characterize the prepregs. The residual solvent content found is 0.2% and the residual gelation time is 56 seconds at 170° C.

EXAMPLE 4

Preparing prepregs with a phosphonic acid-modified epoxy resin

Mix a solution of 76 parts by weight of the reaction product obtained according to Example 2 (epoxy value 0.38 mol/100 g) in methylethyl ketone with a solution of 24 parts by weight of a polyamine ($NH_2$ value 9.35%), prepared according to Example 3, in 52 parts by weight methylethyl ketone and 8 parts by weight dimethylformamide. Process the resulting solution as described in Example 3 to yield prepregs. After drying, these prepregs are nonsticky and are stable when stored at room temperature (max. 21° C. and max. 50% relative humidity) for more than three months. The residual solvent content is 0.2% and the residual gelation time at 170° C. is 43 sec.

EXAMPLE 5

Preparing and testing the laminates

Press 13 of the prepregs prepared according to Examples 3 or 4 (glass cloth grade 2116, weight 106 g/m²) at 175° C. and 65 bar in a press. Remove the 1.5 to 1.6 mm thick laminates from the press after 40 minutes and then after-bake for 2 hours at 200° C. Objects produced in this way were tested by dynamic-mechanical analysis (DMTA) to determine the glass transition temperature $T_G$ and the flammability according to UL 94 V. The resulting values are summarized in Table 1.

TABLE 1

| Example no. | 3 | 4 |
|---|---|---|
| Measured values | | |
| $T_G$ (°C.) | 185 | 192 |
| Average burning time acc. to UL 94 V (sec) | 3.7 | 3.9 |
| Classification | V-0 | V-0 |

EXAMPLE 6

Producing and testing multi-layer cores

Prepregs produced according to Examples 3 and 4 (glass cloth grade 2116, weight 106 g/m²) were pressed to form laminates composed of two layers of prepregs laminated on each side to a 35 μm film of copper (pressing parameters: 175° C., 60 to 65 bar, 40 min) and then after-baked for 2 hours at 200° C. The measling test, the adhesion of the copper film, the solder bath stability and interlaminar adhesion were determined on the 0.30 to 0.33 mm thick laminates. The results are summarized in Table 2.

TABLE 2

| Example no. | 3 | 4 |
|---|---|---|
| Measured values | | |
| Adhesion of the Cu film at RT (N/mm) | 1.6 | 1.6 |
| Measling test (LT26) | + | + |
| Interlaminar adhesion (N/mm) | 1.13 | 1.05 |
| Solder bath resistance at 260° C./60 sec | + | + |

The tests were performed on the laminates as follows:

Thermal stability in the solder bath:

Perform this test according to DIN IEC 249 part 1, section 3.7 using a solder bath according to section 3.7.2.3. Use test objects measuring 25 mm×100 mm and place them with the copper side against the solder bath. There must not be any delamination or measling, spots or bubbles under the lamination.

Adhesion of the copper laminate

Separate a copper film measuring 25 mm×100 mm from the glass cloth over a 20 mm length and pull away the remaining glass cloth at the rate of 50 mm/min straight up using a suitable device. Measure the force F required to do so in N.

Testing interlaminar adhesion

Separate a 20 mm length of the top layer of hard glass cloth from the next underlying layer of hard glass cloth on a strip measuring 25 mm×100 mm and pull away at the rate of 50 mm/min using a suitable device. Measure the force F required to do so in N.

Measling test

Perform this test on test objects measuring 20 mm×100 mm without any copper lamination. Immerse the test objects for 3 minutes in a hot LT26 solution (composition: 850 ml deionized $H_2O$, 50 ml HCl, analytical purity, 100 g $SnCl_2.H_2O$, 50 g thiourea) at 65° C., rinse with running water and then place in boiling water for 20 minutes. After drying the object in air (2 to 3 min), immerse it in a solder bath at 260° C. for 10 sec. The laminate must not show any signs of delamination.

EXAMPLE 7

Preparing phosphonic acid-modified epoxy resins

Prepare phosphonic acid-modified epoxy resins by reacting an epoxidized novolac (epoxy value 0.56 mol/100 g, average functionality 3.6) dissolved in methylethyl ketone with phosphonic acid derivatives. Stir the solutions for 90 minutes at reflux at an oil bath temperature of 100° C.

Composition of the solutions:

1) 440 parts by weight novolac, 170 parts by weight methylethyl ketone and 60 parts by weight propane pyrophosphonic acid;
2) 400 parts by weight novolac, 170 parts by weight methylethyl ketone and 70 parts by weight propane phosphonic acid, monomethyl ester;
3) 400 parts by weight novolac, 156 parts by weight methylethyl ketone and 56 parts by weight methane phosphonic acid, monomethyl ester.

Properties of reaction products nos. 1, 2 and 3:

1) Epoxy value (after 0 hr and 96 hrs): 0.35/0.34 mol/100 g, phosphorus content 3.3%;
2) Epoxy value (after 0 hr and 96 hrs): 0.36/0.34 mol/100 g, phosphorus content 3.4%;
3) Epoxy value (after 0 hr and 96 hrs): 0.38/0.37 mol/100 g, phosphorus content 3.4%.

EXAMPLE 8

Producing prepregs

Mix the reaction products according to Example 7 with a solution of polyamine ($NH_2$ value 9.35%) according to Example 3 in a mixture of methylethyl ketone (MEK) and dimethylformamide (DMF) and also with 2-methylimidazole. Prepare the prepregs by an appropriate method, using glass cloth with a weight of 197 g/m². Dry at temperatures of 50° to 150° C. The prepregs are not sticky and they are stable when stored at room temperature.

Composition of the impregnating solutions:

1) 375 parts by weight reaction product no. 1, 65 parts by weight polyamine, 100 parts by weight MEK, 25 parts by weight DMF and 0.7 part by weight 2-methylimidazole;
2) 385 parts by weight of reaction product no. 2, 65 parts by weight polyamine, 90 parts by weight MEK, 25 parts by weight DMF and 0.7 part by weight 2-methylimidazole;
3) 380 parts by weight of reaction product no. 3, 65 parts by weight polyamine, 90 parts by weight MEK, 25 parts by weight DMF and 0.7 part by weight 2-methylimidazole.

Properties of the prepregs:

| Reaction product no. | 1 | 2 | 3 |
|---|---|---|---|
| Measured values | | | |
| Residual solvent content (%) | 0.1 | 0.3 | 0.4 |
| Residual gelation time at 170° C. (sec) | 40 | 75 | 109 |

EXAMPLE 9

Producing and testing laminates

Press eight of the prepregs produced according to Example 8 (glass cloth grade 7628, weight 197 g/m²) in a press at 175° C. and 50 bar. Treat the resulting 1.5 to 1.6 mm thick laminates further according to Example 5 and then test them. This yields the following results:

| Reaction product no. | 1 | 2 | 3 |
|---|---|---|---|
| Measured values | | | |
| $T_G$ (°C.) | 182 | 180 | 190 |
| Average burning time acc. to UL 94 (sec) | 4.6 | 4.7 | 3.6 |
| Classification | V-0 | V-0 | V-0 |

EXAMPLE 10

Producing and testing multi-layer cores

Prepregs were produced according to Example 8 (glass cloth grade 7628, weight 197 g/m²) as described in Example 6 and then after-baked. The adhesion of the copper film, the measling test, the solder bath stability and the interlaminar adhesion were determined on the resulting 0.35 to 0.37 mm thick laminates, yielding the following results:

| Reaction product no. | 1 | 2 | 3 |
|---|---|---|---|
| Measured values: | | | |
| Adhesion of the copper film at RT (N/mm) | 1.7 | 1.6 | 1.7 |
| Measling test (LT26) | + | + | + |
| Interlaminar adhesion (N/mm) | 1.20 | 1.13 | 1.15 |
| Solder bath stability at 260° C./60 sec | + | + | + |

What is claimed is:

1. An epoxy resin mixture for producing prepregs and composites, comprising:
a phosphorus-modified epoxy resin with an epoxy value of 0.02 to 1 mol/100 g, and an average molecular weight, $M_n$, of up to 10,000, which is a reaction product of
(A) a polyepoxy compound with at least two epoxy groups per molecule and
(B) at least one compound selected from the group consisting of phosphinic acids, phosphonic acids, pyrophosphonic acids and phosphonic acid monoesters, and
an aromatic polyamine hardener with the following structure:

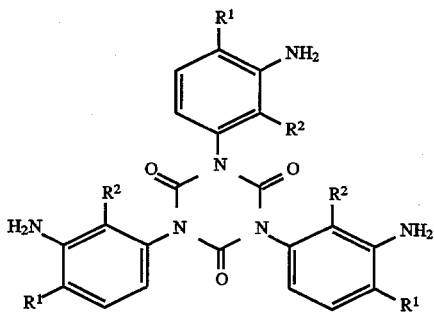

where one of the $R^1$ and $R^2$ groups on each of the three aromatic rings denotes a hydrogen and the other is alkyl.

2. The epoxy resin mixture according to claim 1, wherein the phosphorus content of the phosphorus-modified epoxy resin is from 0.5 to 13 wt %.

3. The epoxy resin mixture according to claim 2, wherein the phosphorus content of the phosphorus-modified epoxy resin is from 1 to 8 wt %.

4. The epoxy resin mixture according to claim 1, further comprising a phosphorus-free aromatic or heterocyclic epoxy resin, or a mixture thereof.

5. The epoxy resin mixture according to claim 4, further comprising a cycloaliphatic epoxy resin.

6. The epoxy resin mixture according to claim 4, wherein up to 80 wt % of the phosphorus-modified epoxy resin is replaced by the phosphorus-free epoxy resin.

7. The epoxy resin mixture according to claim 1, wherein the ratio of the epoxy function to the amine hydrogen function is from 1:0.5 to 1:1.1.

8. The epoxy resin mixture according to claim 7, wherein the ratio of the epoxy function to the amine hydrogen function is from 1:0.7 to 1:0.9.

9. The epoxy resin mixture according to claim 1, wherein the hardener is in a mixture with other aromatic or heterocyclic polyamines.

10. The epoxy resin mixture according to claim 1, further comprising an accelerator.

11. The epoxy resin mixture according to claim 1, wherein the phosphorus content is from 0.5 to 6 wt % based on the resin mixture.

12. The epoxy resin mixture according to claim 11, wherein the phosphorus content is from 1 to 4 wt % based on the resin mixture.

13. A prepreg based on organic or inorganic reinforcing materials in the form of fibers, nonwovens or wovens, produced from the epoxy resin mixture according to claim 1.

14. A composite based on organic or inorganic reinforcing materials in the form of fibers, nonwovens or wovens, produced from the epoxy resin mixture according to claim 1.

15. A circuit board made of prepregs produced from fiberglass cloth and the epoxy resin mixture according to claim 1.

16. The epoxy resin mixture according to claim 11, wherein the phosphorous-modified epoxy resin has a molecular weight of from about 200 to about 5,000.

17. The epoxy resin mixture according to claim 1, wherein the cured mixture has a $T_g$ greater than or equal to 180° C.

* * * * *

UNITED STATES PATENT AND TRADEMARK OFFICE
CERTIFICATE OF CORRECTION

PATENT No. : 5,648,171

DATED : July 15, 1997

INVENTOR(S): Wolfgang von GENTZKOW et al.

It is certified that error appears in the above-identified patent and that said Letters Patent is hereby corrected as shown below:

On the title page: change "[73] Assignee: Siemens Aktiengesellschaft, München, Germany" to --[73] Assignees: Siemens Aktiengesellschaft, München, Germany and Hoechst Aktiengesellschaft, Frankfurt am Main, Germany--.

Signed and Sealed this

Twenty-sixth Day of May, 1998

*Attest:*

BRUCE LEHMAN

*Attesting Officer*     *Commissioner of Patents and Trademarks*